(12) United States Patent
Magrath

(10) Patent No.: US 7,061,415 B2
(45) Date of Patent: Jun. 13, 2006

(54) WORD LENGTH REDUCTION CIRCUIT

(75) Inventor: Anthony J. Magrath, Edinburgh (GB)

(73) Assignee: Wolfson Microelectronics plc, Edinburgh (GB)

(*) Notice: Subject to any disclaimer, the term of this patent is extended or adjusted under 35 U.S.C. 154(b) by 29 days.

(21) Appl. No.: 10/777,763

(22) Filed: Feb. 13, 2004

(65) Prior Publication Data
US 2005/0122241 A1   Jun. 9, 2005

(30) Foreign Application Priority Data
Dec. 5, 2003 (GB) ................... 0328298.5

(51) Int. Cl.
H03M 3/00 (2006.01)
H03K 7/08 (2006.01)
H03K 9/08 (2006.01)

(52) U.S. Cl. ................... 341/143; 375/238

(58) Field of Classification Search ........... 341/143, 341/50, 53, 76, 152; 375/240.03, 245, 362, 375/242, 238
See application file for complete search history.

(56) References Cited

U.S. PATENT DOCUMENTS

| | | | |
|---|---|---|---|
| 4,467,291 A * | 8/1984 | Roza | 341/143 |
| 4,692,737 A * | 9/1987 | Stikvoort et al. | 341/50 |
| 5,070,515 A * | 12/1991 | Iwahashi et al. | 375/245 |
| 5,089,818 A * | 2/1992 | Mahieux et al. | 341/76 |
| 5,115,241 A * | 5/1992 | Ishikawa | 341/143 |
| 5,230,012 A * | 7/1993 | Schenk | 375/362 |
| 5,461,422 A * | 10/1995 | Hsieh | 375/240.03 |
| 5,559,467 A * | 9/1996 | Smedley | 330/10 |
| 5,654,711 A * | 8/1997 | Fujimori | 341/143 |

(Continued)

FOREIGN PATENT DOCUMENTS

WO   WO 2004/013972 A3   2/2004

OTHER PUBLICATIONS

D. Reefman et al., "Signal processing for Direct Stream Digital", A Tutorial for Digital Sigma Delta Modulation and 1-Bit Digital Audio Processing, Version 1.0, Dec. 18, 2002.

(Continued)

*Primary Examiner*—Patrick Wamsley
(74) *Attorney, Agent, or Firm*—Dickstein Shapiro Morin & Oshinsky LLP

(57) ABSTRACT

The present invention relates to noise shaping, especially although not exclusively for digital audio signal processing; and in particular for PCM-PWM converters in a digital amplifier. The present invention provides a Converter for converting a pulse coded modulation (PCM) digital audio signal to a pulse width modulated (PWM) digital audio signal for amplification in a digital amplifier; the Converter comprising: a word length reduction circuit for quantising an N-bit input signal sample into an n-bit output signal sample; the circuit comprising: an input for receiving the N-bit input signal samples; a quantiser coupled to the input, and arranged to output an n-bit signal corresponding to the N-bit input sample signal; a feedback loop comprising a loop filter coupled between the output of the quantiser and the word length reduction circuit input, the loop filter having a second feedback loop coupled between the output and the input of the loop filter; and a modulator for converting the PCM signals to PWM signals, the modulator coupled to the output of the quantising circuit. There is also provided an improved lineariser which combines an interpolator to determine intermediate samples and straight line approximations between all the samples to determine a more accurate cross point for linearising the output sample values.

32 Claims, 9 Drawing Sheets

U.S. PATENT DOCUMENTS

| | | | |
|---|---|---|---|
| 5,784,017 | A | 7/1998 | Craven |
| 5,959,562 | A * | 9/1999 | Wiesbauer ................... 341/143 |
| 6,184,812 | B1 * | 2/2001 | Younis et al. ............... 341/143 |
| 6,404,369 | B1 * | 6/2002 | Sheen ........................ 341/143 |
| 6,567,025 | B1 * | 5/2003 | Schreier et al. ............. 341/143 |
| 6,724,332 | B1 * | 4/2004 | Melanson ................... 341/143 |
| 6,738,004 | B1 * | 5/2004 | Melanson ................... 341/143 |
| 6,741,123 | B1 * | 5/2004 | Andersen et al. ............ 330/10 |
| 6,822,594 | B1 * | 11/2004 | Melanson et al. .......... 341/143 |
| 6,885,330 | B1 * | 4/2005 | Trotter et al. ............... 341/152 |
| 2005/0046601 | A1 * | 3/2005 | Alrutz et al. ................. 341/53 |
| 2005/0110667 | A1 * | 5/2005 | Borisavljevic .............. 341/152 |

OTHER PUBLICATIONS

"Architectures for Noise-Shaping Loop", 10.2, pp. 311-323.

M. Pedersen et al., "All Digital Power Amplifier Based on Pulse Width Modulation," Presented at the 96th AES Convention 1994.

M. Sandler et al., "Ultra Low Distortion Digital Power Amplification," Presented at the 91st AES Convention 1991.

C. Pascual et al., "Computationally Efficient Conversion from Pulse-Code Modulation to Naturally Sampled Pulse-Width Modulation," Presented at the 109th AES Convention, 2000.

P. Craven, "Toward the 24-bit DAC: Novel Noise-Shaping Topologies Incorporating Correction for the Nonlinearity in a PWM Output Stage," *J. Audio Eng. Soc.*, vol. 41, No. 5, May 1993, pp. 291-313.

C. Tewksbury et al., "Oversampled, Linear Predictive and Noise-Shaping Coders of Order N>1", *IEEE Trans Circuits and Sys.*, vol. CAS-25, pp. 436-447, Jul. 1978.

M. Pedersen et al., "All Digital Power Amplifier Based on Pulse Width Modulation," Presented at the 96th AES Convention no month 1994.

M. Sandler et al., "Ultra Low Distortion Digital Power Amplification," Presented at the 91st AES Convention no month 1991.

C. Pascual et al., "Computationally Efficient Conversion from Pulse-Code Modulation to Naturally Sampled Pulse-Width Modulation," Presented at the 109th AES Convention, no month 2000.

P. Craven, "Toward the 24-bit DAC: Novel Noise-Shaping Topologies Incorporating Correction for the Nonlinearity in a PWM Output Stage," *J. Audio Eng. Soc.*, vol. 41, No. 5, May no date 1993, pp. 291-313.

C. Tewksbury et al., "Oversampled, Linear Predictive and Noise-Shaping Coders of Order N>1", *IEEE Trans Circuits and Sys.*, vol. CAS-25, pp. 436-447, Jul. no month 1978.

* cited by examiner

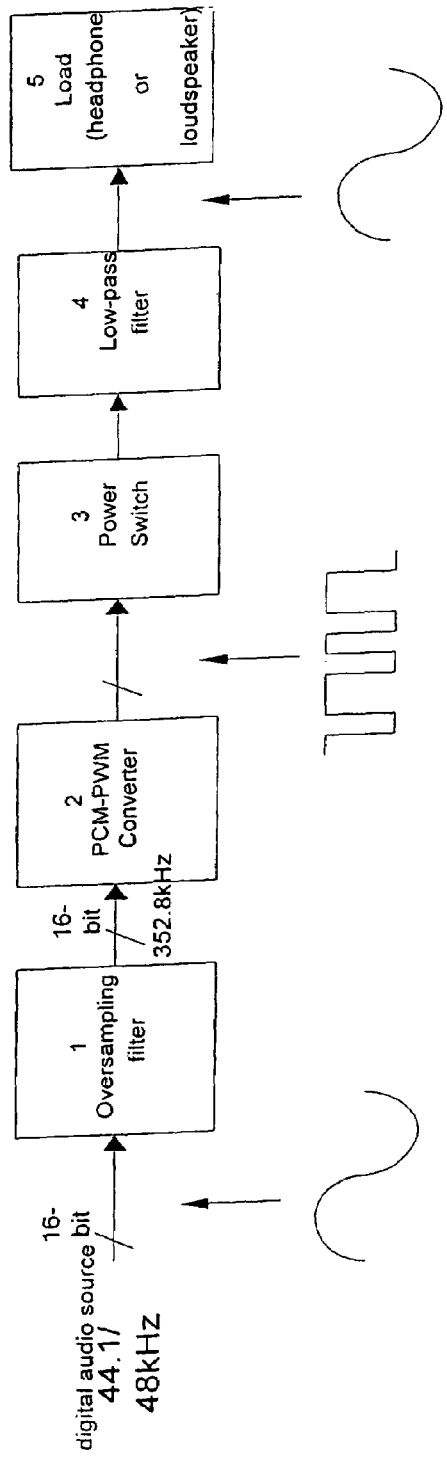
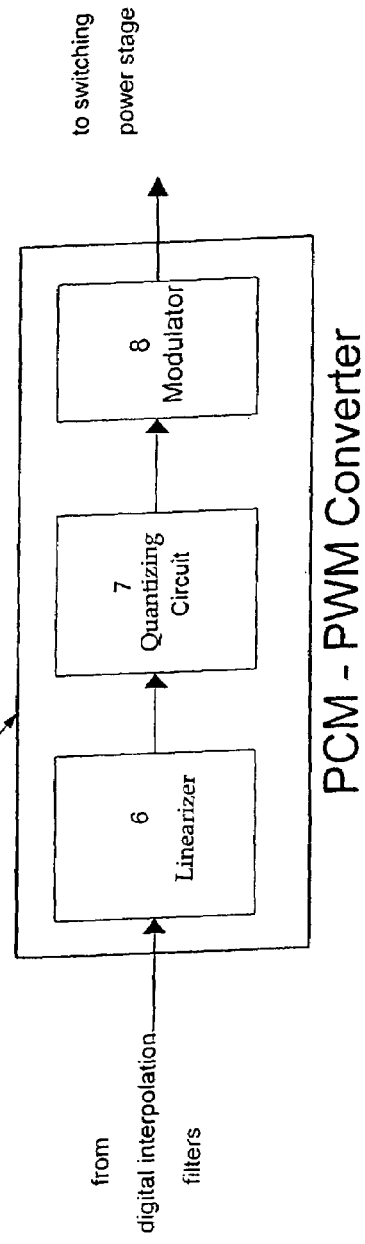

G(z)

H(z)

WORD LENGTH REDUCTION CIRCUIT

FIELD OF THE INVENTION

The present invention relates to a circuit for digital word-length reduction especially although not exclusively for processing digital audio signals; and in particular for PCM-PWM converters in a digital amplifier.

BACKGROUND OF THE INVENTION

Digital amplifiers are typically employed for high efficiency applications such as audio amplification in portable devices such as personal stereos where battery life is a significant consideration. They are also used in high power amplification where the high efficiency means that the size and cost of the power supplies and heatsinks can be reduced. These amplifiers typically utilise pulse width modulation (PWM) or pulse density modulation (PDM) to drive a switching power stage. However the source signals are typically stored as encoded sampled signals on a carrier such as a CD-ROM or as MP3 tracks on a memory device for example. Pulse Code Modulation (PCM) is a standard for encoding CD stored music samples, and hence a PCM-PWM Converter is needed to convert the multi-level PCM input signal to a two- or three-level PWM signal.

A schematic of a digital amplifier for digital audio and employing a PCM-PWM Converter is shown in FIG. 1, the amplifier comprising an over-sampling filter 1, a Converter 2, a power switch 3, a low pass filter 4, and a headphone or loudspeaker load 5.

The input to a digital Class-D amplifier is a series of (eg PCM) digital words representing signal amplitude levels over time. The over-sampling or interpolation filter adds additional samples from the incoming audio source samples by interpolating between the actual samples, thereby effectively increasing the sampling rate as is known. The over-sampled audio signal is fed to the Converter 2 which comprises a modulator to convert these words into a series of bits, (PDM) or on/off pulses of varying width (PWM) suitable for switching the switching element 3. The input signal modulates the output pulse width in the case of a Pulse Width Modulator, or the output pulse (bit) density in the case of a sigma-delta modulator. The power switch 3 switches a much larger output voltage into a low pass filter 4 which turns this signal into an analog signal for applying to the headphone or speaker load 5. The switch element 3 is either fully on or off and is switched at a high frequency with a duty cycle that is proportional to the amplitude of the input signal.

Referring to FIG. 2, a PCM-PWM Converter is shown which receives a series of digital words (PCM) representing signal amplitude samples over time. The PCM-PWM Converter 2 utilizes a linearizer 6, a word length reduction circuit (WLR) 7 and a PWM modulator 8.

The Pulse Width Modulator 8 generates an output which is either fully on or off (in a bi-phase or two-level application) and which is switched at a high frequency with a pulse width that is proportional to the amplitude of its input signal. The modulator 8 uses a saw-tooth modulation waveform which is compared with the incoming signal to determine the width of an output pulse as shown by the uniformly sampled PWM waveform in FIG. 3. In particular, a sample of the input signal is compared against the saw-tooth waveform, the vertical portion of which defines the start of a pulse corresponding to that sample. The end of the pulse for that sample occurs when the sloping part of the waveform crosses or equals the value of the sample. It can be seen that where the input signal amplitude is high, this will not occur until nearly the full duration of the pulse; and so a wide pulse will be output. Conversely where the signal input is low, the saw-tooth waveform will cross the input sample value early resulting in a narrow pulse width. This is known as Uniformly Sampled Pulse-Width Modulation. The sawtooth is generated using a digital counter circuit and therefore contains discrete steps.

A problem with PWM conversion of digitally sampled signals however, is that an error arises because the digital sample is held until it crosses the sawtooth waveform, whereas the equivalent analog signal is still varying. Therefore a width-error occurs in uniformly-sampled PWM. This can be seen in FIG. 3, which also shows Naturally Sampled Pulse-Width Modulation in which the corresponding analog input waveform is compared with the sawtooth waveform. This is theoretically free from harmonic distortion. In uniformly sampled PWM, the input waveform has already been regularly sampled at the points shown, and since the amplitude of the samples is different than in naturally sampled PWM at the point where the held sample crosses the sawtooth waveform, the width of the pulses are also different as shown.

Therefore the sampling process introduces some sampling error, resulting in harmonic distortion and noise-intermodulation. Noise-intermodulation is a process where high frequency noise components modulate with each other, or with high-frequency periodic components to produce noise products that fold back into the baseband. This reduces the baseband SNR of the system.

To reduce harmonic distortion and noise-intermodulation, a Lineariser 6 is often used to pre-distort the input signal to effectively cancel out the distortion introduced by the sampled nature of the input source. A Lineariser modifies the amplitude of the samples being fed into the modulator 8 so as to minimise the error between the pulse-widths that the modulator produces and the widths that would be produced from an equivalent analogue-input (naturally sampled) modulator, and hence to minimise the crossing point error outlined above. This is typically done by determining adjacent input sample values to derive a slope of the input signal, and adjusting one or both of these values in order to get a more accurate representation of the analogue signal at the cross point, and hence the end point of the corresponding pulse. This brings operation of the Converter 2 closer to the ideal natural sampled PWM resulting in lower levels of harmonic distortion and noise-intermodulation.

A common class of linearisation algorithm emulates Naturally Sampled PWM. The first published technique which emulates Naturally Sampled PWM is termed Enhanced Sampling and was introduced in P. H Mellor, S. P. Leigh and B. M. G Cheetham, "Reduction of spectral distortion in class D amplifiers by an enhanced pulse width modulation sampling process", IEE Proceedings G, Circuits, Devices and Systems, vol 138 no 4, pp 441–448, August 1991. The algorithm estimates the time that the input signal crosses the reference waveform using a straight-line interpolation between adjacent samples. This cross-time is then used to calculate the width of each pulse, as shown in FIG. 4. It can be seen that the pulse-widths are a closer approximation of Naturally-Sampled PWM.

The problem with Enhanced Sampling is that the straight-line interpolation is not very accurate in determining the exact cross-time. The basic algorithm has therefore been enhanced in a number of ways, for example using polynomial interpolation as discussed in M. Sandler, J. Goldberg, R. Hiorns, R. Bowman, W. Watson, P. Ziman, "Ultra Low Distortion Digital Power Amplification", AES 91st Convention, October 1991, preprint 3115 and C. Pascual, B. Roeckner, "Computationally Efficient Conversion from Pulse-Code Modulation to Naturally Sampled Pulse-Width Modulation", AES 109th Convention, 2000 September.

In M. S. Pedersen, M. Shajaan, "All Digital Power Amplifier Based on Pulse-Width Modulation", AES 96th Convention, February 1994. Preprint 3809, the sample-rate is increased using Interpolation filters to derive a center-point. Straight-line interpolation is then used between the center-point and the original points to derive a more accurate cross point. The sampling process can thereby be made to closely match the original naturally sampled waveform, hence the harmonic distortion is much reduced.

A problem with digital Pulse-Width modulators however is that they require the use of a high-frequency clock to precisely time the pulse-edges. The frequency of the clock depends on the wordlength of the PWM input. For an input of N-bits and oversampling rate Fs, the clock frequency required is $Fs.2^N$, since each input amplitude is represented by a different pulse width. In a standard CD music application this implies a sampling rate of 352.8 kHz$\times 2^{16}$=23 GHz. Such a high clock rate is not practicable.

To reduce the input wordlength and hence reduce the clock frequency, a noise-shaper or a sigma-delta modulator (SDM) architecture is commonly employed before the PWM modulator 8, as the Word Length Reduction Circuit (WLR) 7. Both techniques use feedback within the WLR 7 to redistribute the quantization noise caused by reducing the wordlength to higher frequencies where it is less audible and can be filtered by the output filter 4 of the power switching stage.

To ensure that enough quantisation noise is scooped out of the baseband by this noise redistribution, a high order loop filter within the WLR is preferred, typically 4th or 5th order. For these high orders, the efficiency of implementation of the loop filter becomes important.

At high order it is common to use sigma-delta modulation, which commonly uses a cascade integrator structure for its loop filter that offers very low sensitivity to coefficient quantization. In practice it is possible to quantize the coefficients to only 1- or 2-bits without compromising the performance of the modulator. The multiplier can then be replaced by a small number of adds, reducing the complexity of the silicon design.

However, when a SDM WLR circuit 7 is used between the lineariser 6 and modulator 8, the linearisation algorithm fails, and distortion is present in the output signal. This is because the SDM (7) filters the incoming signal, effectively modifying the cross-points that have been calculated by the linearisation algorithm.

This problem has been addressed by combining the sigma-delta modulator and lineariser, such that the lineariser "sees" the output of the SDM directly and can therefore provide the necessary amplitude correction, as discussed in P. Craven. "Towards the 24-bit DAC. Novel Noise-Shaping Topologies Incorporating Correction for the Nonlinearity in a PWM Output Stage", J. AES Vol 41, No 5 1993 May. However this solution is complex to implement.

Alternatively a Noise-shaper can be used, which does not filter the input signal, and so does not affect the performance of the linearizer. A commonly used class of high-order noise shaper WLR circuits are described in S. K. Tewkesbury, "Oversampled, Linear Predictive and Noise-Shaping Coders of Order N>1", IEEE Trans. Circuits and Systems, vol CAS-25, pp 436–447, July 1978. This type of WLR circuit, while efficient to implement, has the disadvantage of having high gain at high frequencies, resulting in high levels of out-of-band noise. This increases the amount of noise-intermodulation introduced by the PWM modulator 8, producing a poor SNR at the output of the Converter 2.

More general IIR Filters can also be used as loop filters in a noise-shaping WLR circuit, for example Direct Form implementations, which can be designed with lower gain at high-frequencies. However these filters have high coefficient sensitivity, and therefore full multipliers with large coefficient word lengths are needed which are expensive to implement and requires extra silicon real-estate.

SUMMARY OF THE INVENTION

In general terms in one aspect the present invention provides a word length reduction circuit (WLR) for a PCM-PWM Converter which comprises a noise shaper based signal path combined with a sigma-delta modulator filter based feedback path. There is provided a noise shaper circuit architecture with a loop filter in an outer feedback loop which additionally has a local or inner feedback loop around the loop filter.

This has the effect of taking the loop filter G(z) out of the input signal path, as in the case of a noise shaper based architecture WLR. In other words the WLR architecture has a non-filtered transfer function for the input signal, thus not affecting the cross-point calculation of the lineariser, and hence reducing distortion. At the same time it provides a noise transfer function (NTF) of $1/(1+G(z))$ where G(z) is the loop filter. This is the same NTF as for a sigma delta based architecture WLR but allows for the use of easy to implement loop filters G(z) such as those used in sigma delta based architectures, but without their detrimental effect on the input signal path, and in particular their detrimental effect on the pre-distorting effect of a Lineariser. In other words, Quantisation noise is shaped using error feedback with a simple loop filter.

In an embodiment this allows integrator based filter circuits to be used as the noise shaper loop filter, and therefore provides the implementation advantages provided by such filter structures in a noise shaper architecture. For example a cascade-of-integrator structure offers very low sensitivity to coefficient quantization. This means that the multipliers can be replaced by single shifters, or the addition of 2 or 3 shifter outputs, vastly decreasing the silicon area of the design.

In particular in one aspect the present invention provides a word length reduction circuit for quantising an N-bit input signal sample into an n-bit output signal sample; the circuit comprising: an input for receiving the N-bit input signal samples; a quantiser coupled to the input, and arranged to output an n-bit signal corresponding to the N-bit input sample signal; an outer feedback loop comprising a loop filter coupled between the output of the quantiser and subtraction means coupled to the word length reduction circuit input and for subtracting a feedback signal from the input signal, the loop filter having an inner feedback loop coupled between the output and the input of the loop filter.

Preferably the loop filter is a cascade of integrators type. Preferably this is a sigma delta type of loop filter. Preferably the loop filter coefficients are implemented using shifters. This is an easy and cheap to implement filter type, and provides low sensitivity to coefficients.

In particular in another aspect the present invention provides a noise shaper circuit for reducing the word length of a digital audio amplifier, the circuit comprising a quantiser in a feedback loop with a loop filter, the circuit arranged such that the input signal is unfiltered and the noise transfer function is $1/(1+G(z))$ where $G(z)$ is the loop filter. The loop filter preferably has high gain at base band frequencies and high attenuation at high or non-base band frequencies. The loop filter is preferably a cascade of integrators type. Preferably the loop filter is located in the feedback loop and has an inner feedback loop coupled between its input and output.

There is also provided a corresponding method of reducing the word length of a sample, especially for application in a converter for a digital amplifier. There is also provided a corresponding computer program for implementing the methods provided.

In general terms in another aspect the present invention provides a Lineariser for a Converter for a PWM digital audio amplifier, the Lineariser being arranged to determine a cross point amplitude for the point at which its input signal waveform defined by two input samples crosses or equals a reference waveform equivalent to that used by the PWM modulator. An input signal waveform sample amplitude is then adjusted to said cross point amplitude. This is achieved by determining a mid-point or intermediate sample between two otherwise adjacent input signal samples using an interpolation filter for example. A calculation is then performed using the mid-point sample and one of the input samples depending on the polarity of the mid-point sample, in order to determine a cross point between the waveform defined by said input sample and the mid-point sample. The calculation performed depends on the polarity of the mid-point samples amplitude—ie there is one calculation formula or algorithm for a negative mid-point sample amplitude and another for a positive mid-point sample. The input sample then has its amplitude adjusted to correspond to that of the cross-point.

This provides increased accuracy when determining the cross-point in the modulator as the adjusted or linearised sample is used to compare with the reference waveform resulting in a pulse width closer to that achievable with natural sampling.

In particular in one aspect the present invention provides a Lineariser for a Converter wherein the Lineariser receives input signal samples and comprises:

means for interpolating said input signal in order to determine an intermediate sample between two adjacent input signal samples;

means for determining the polarity of the intermediate point;

means for determining at what signal amplitude an input signal waveform defined by the input and intermediate samples crosses a reference waveform by applying one of two estimation algorithms dependent on the polarity of the intermediate sample;

means for outputting signal samples corresponding to said input signal samples wherein one of the output signal samples has a value corresponding to the determined signal amplitude.

In particular in another aspect the present invention provides a Lineariser for a Converter wherein the Lineariser receives input signal samples and comprises:

means for interpolating said input signal in order to generate interpolated samples;

means for determining linear approximations between the interpolated points;

means for determining at what signal amplitude an input signal waveform defined by the linear approximations crosses a reference waveform;

means for outputting signal samples corresponding to said input signal samples wherein the output signal samples have values corresponding to the determined signal amplitudes.

There are also provided methods of linearising a digital input signal corresponding to the above definition, and corresponding software or a computer program.

Advantageously, the above defined lineariser and the above defined word length reduction circuit may be combined, for example in a Converter for a PWM based digital amplifier.

BRIEF DESCRIPTION OF THE DRAWINGS

Embodiments will now be described with reference to the following drawings, by way of example only and without intending to be limiting, in which:

FIG. 1 is a schematic of a digital amplifier

FIG. 2 is a schematic of a PCM-PWM Converter incorporated in the Converter of FIG. 1;

DETAILED DESCRIPTION

Figure 3:
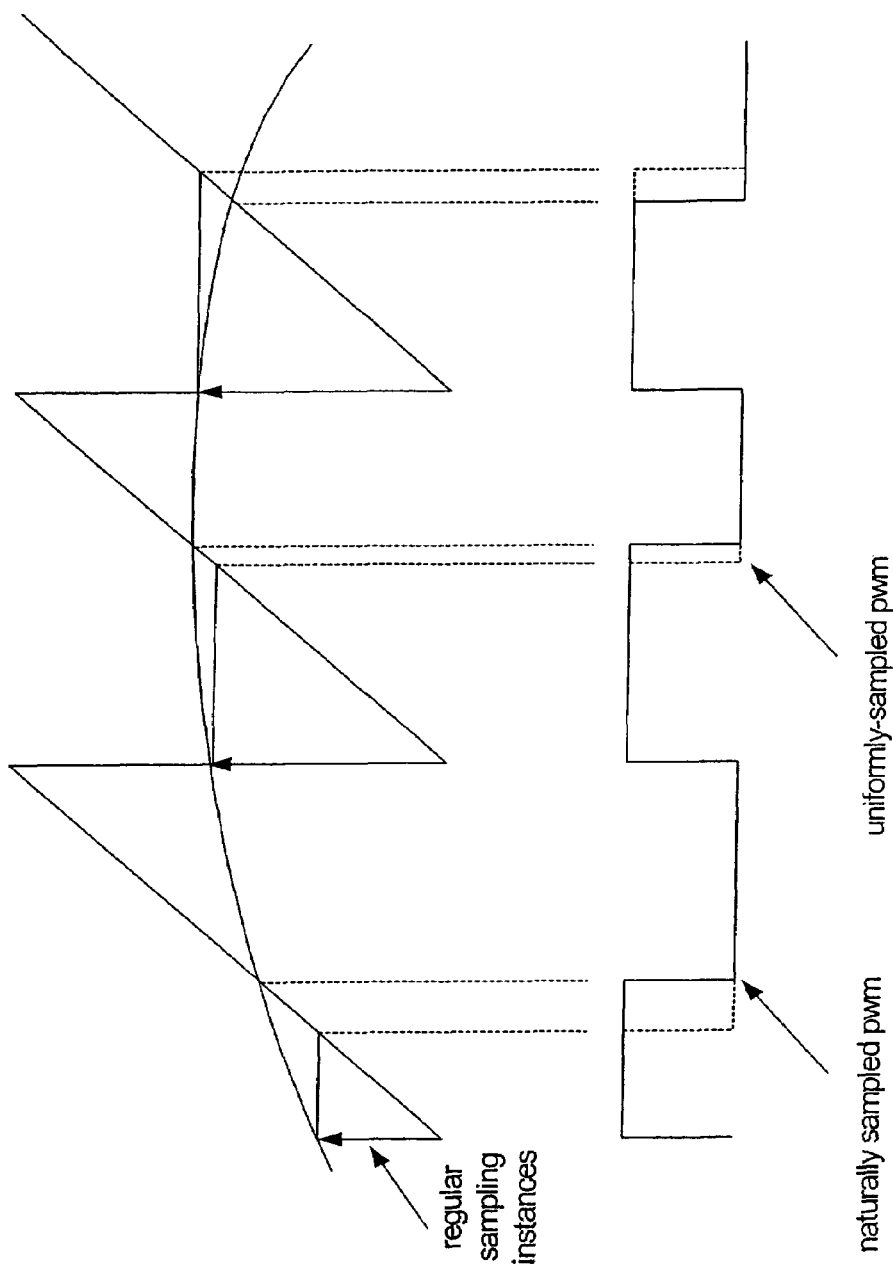
FIG. 3 is a graph showing naturally and uniformly sampled PWM.
Figure 4:
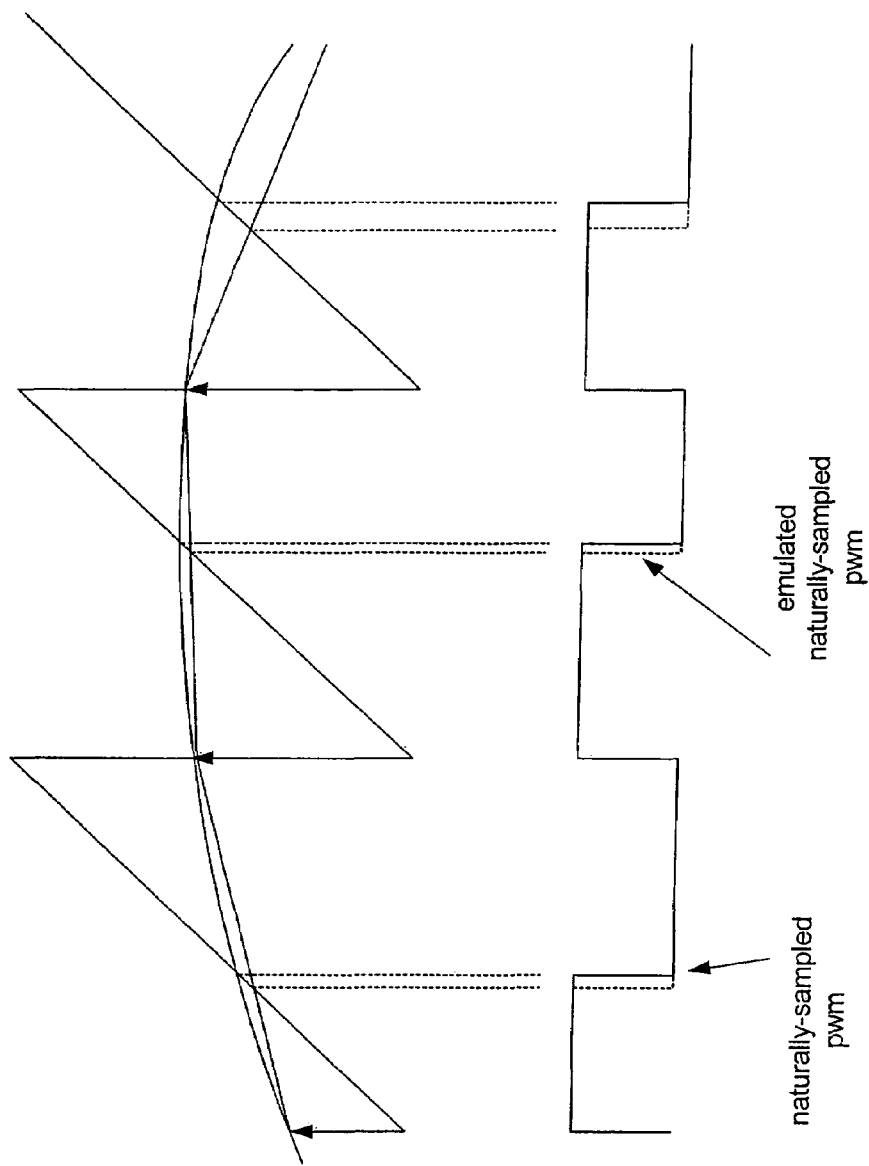
FIG. 4 is a graph showing naturally sampled PWM and emulated naturally sampled PWM.

Referring again to FIGS. 1 and 2 for the case of pulse width modulation, this shows a digital amplifier which receives a PCM source signal from a CD player or the like. This signal is oversampled or interpolated by the interpolation filters 1 which add additional samples from the incoming audio source samples by interpolating between the actual samples. This effectively increases the sampling rate, and thereby provides extra bandwidth for noise shaping.

The over-sampled audio signal is fed to a PCM-PWM Converter 2 which comprises a pulse width modulator 8. The modulator 8 converts the signal into a series of pulses the input signal modulating the pulse width of the output pulses. As explained above, this is typically achieved using a saw-tooth modulating waveform which is compared against the current sample to determine the width of its corresponding output pulse. The series of pulses or bits control the power switch 3 which switches a much larger output voltage into a low pass filter 4 which turns this signal into an analogue signal as known for applying to the headphone or speaker load 5.

The Converter 2 preferably also comprises a Lineariser 6 which adjusts the incoming sample stream of PCM words to improve the PWM representation of the analogue waveform being represented according to one of a number of linearisation algorithms as described above. In particular the lineariser 6 modifies the amplitude of the samples being fed in to the modulator 8 so as to minimise the error between the pulse-widths that the modulator produces and the widths that would be produced from an equivalent analogue-input (naturally sampled) modulator.

Because of the high sample rate and word length of the incoming signal, the PCM-PWM converter 2 also requires a word length reduction circuit (WLR) 7 in order to reduce the word length of the samples and hence reduce the clock rate requirement for the PWM modulator 8 as discussed previously. Various WLR circuit 7 architectures are available as discussed below. These include noise-shaper and sigma-delta architectures, Both techniques use feedback within the WLR to redistribute the quantization noise created by the reduction in word length to higher frequencies where it is less audible and can be filtered by the output filter of the power switching stage.

Whilst the clock speed requirement is most onerous for PWM modulators, pulse density modulators can also benefit from the inclusion of a WLR circuit 7 in a PCM-PDM converter circuit. In this case the PDM modulator 8 may have a sigma-delta modulator architecture, and similarly the WLR circuitry may also have a sigma-delta modulator or noise shaper architecture. Alternatives for both circuits include bit flipping sigma delta modulators.

Figure 5:
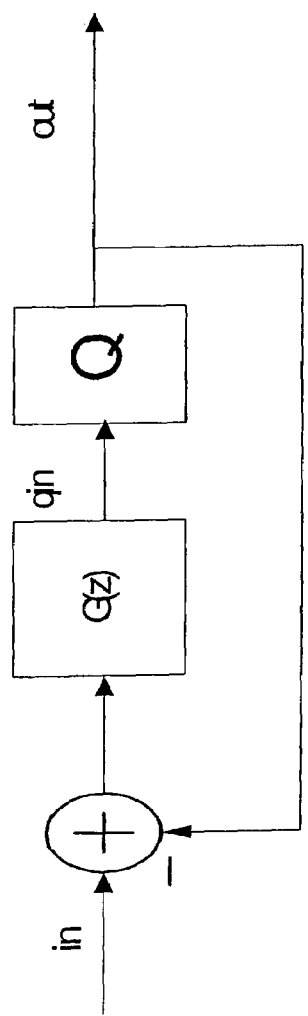
FIG. 5 shows a schematic of a sigma-delta modulator word length reduction circuit architecture.

FIG. 5 shows a sigma-delta architecture for the WLR circuit 7. The output n-bit signal is subtracted from input N-bit signal and the resulting error signal is passed through loop filter G(z) and then reduced from N-bit to n-bit representation by quantiser Q, typically just by truncating the least significant bits, causing an error E(z) between the inputs and outputs of Q. For an input X(z), the output of the modulator is given by:

$$Y(z) = X(z)\frac{G(z)}{1+G(z)} + E(z)\frac{1}{1+G(z)}$$

It can be seen that the error is filtered by the transfer function 1/(1+G(z)) which is the noise-shaping function that provides attenuation of the low frequency (baseband) signals. However the input signal is filtered by the transfer function G(z)/(1+G(z)) which is problematic as it interferes with the effect of the Lineariser 6 on the input signal. As the Lineariser's output is filtered by the sigma delta modulator, the cross-points that have been calculated by the linearisation algorithm are effectively modified. As the cross-points have been moved, the improvement in PWM performance that would otherwise have been provided by the pre-distorting effects on the input signal by the lineariser 6 is removed, leading to increased distortion.

Figure 6:
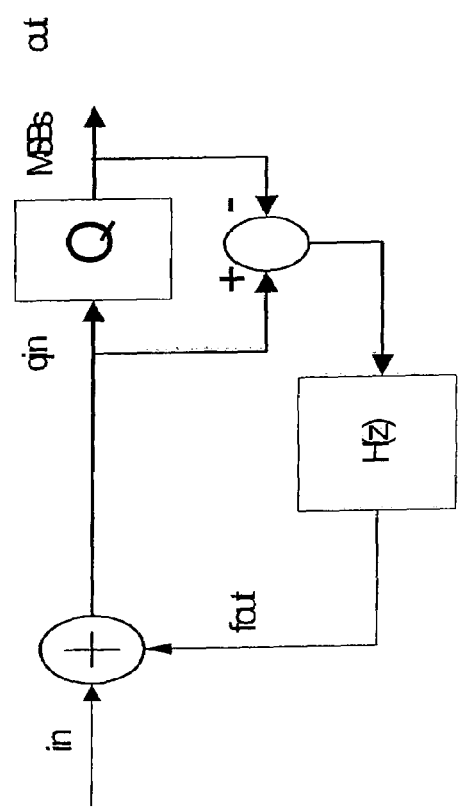
FIG. 6 shows a schematic of a noise-shaper word length reduction circuit architecture.

FIG. 6 shows a noise-shaper architecture for the WLR circuit 7. In this architecture the error E(z) caused by the word length truncation in the internal quantiser circuit Q is filtered by a loop filter H(z) before being subtracted from the input signal. For an input X(z), the output of the modulator is given by:

$$Y(z)=X(z)+E(z)(1-H(z))$$

Note that the signal from the Lineariser 6 is no longer filtered. However compared with the sigma delta modulator WLR architecture, in which performance is quite insensitive to coefficient rounding in the loop filter G(z), it is found that there is a much more severe trade-off between loop filter complexity or coefficient word length and performance for the loop filter H(z) required in the noise shaper architecture. If a simple loop filter with a transfer function such as $(1-z^{-1})^N$, is used, the resulting quantisation noise transfer function (1−H(z)) has the disadvantage of having high noise gain at high frequencies, resulting in high levels of out-of-band noise. This increases the amount of noise-intermodulation introduced by the PWM modulator 8, producing a poor SNR at the output of the Converter 2. More general IIR filters, for example Direct Form implementations, which can be designed with lower gain at high-frequencies, can be used to reduce this problem. However these filters have high coefficient sensitivity, and therefore full multipliers are needed which are expensive to implement and requires extra silicon real-estate.

Figure 7:
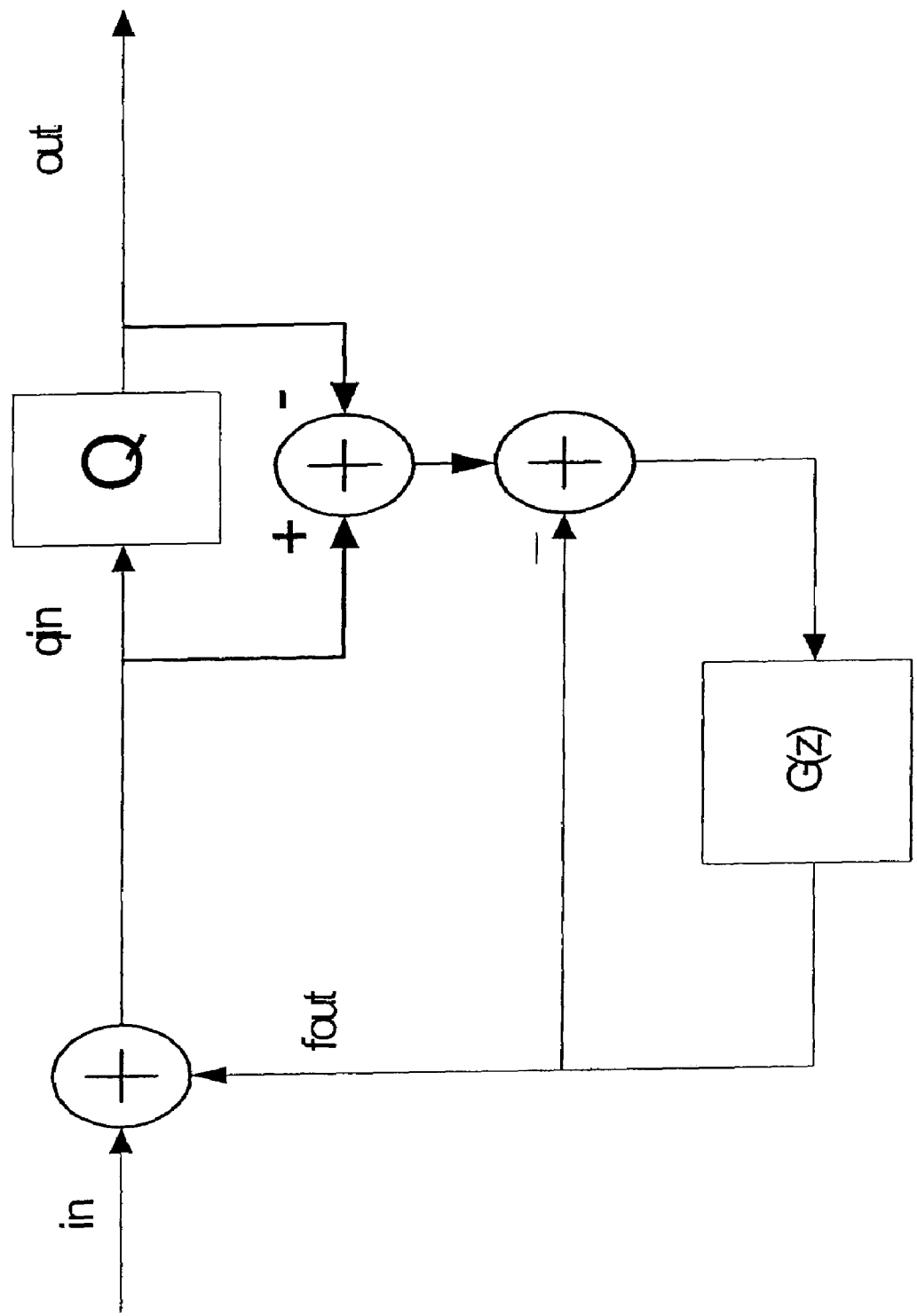
FIG. 7 shows a schematic of a word length reduction circuit according to an embodiment.

FIG. 7 shows a modified WLR circuit according to an embodiment. A noise shaper architecture has been modified to incorporate the same loop filter G(z) as would be used in a sigma-delta implementation in its own (inner) feedback loop into the (outer) feedback or noise loop of the WLR circuit 7. Thus the usual noise shaper loop filter H(z) is replaced by a sigma-delta loop filter in a local or inner feedback loop. This modifies the transfer function of the noise-shaper, according to the equation:

$$Y(z) = X(z) + E(z)\frac{1}{1+G(z)}$$

It can be seen that the noise-transfer function is identical to that of the sigma-delta modulator, and additionally that the input signal (from the Lineariser) is not filtered. Thus due to the use of error-feedback (rather than signal feed-back as in the case of standard sigma delta modulators), the performance of the linearisation algorithm is not affected. This allows an easier (and hence cheaper) to implement sigma delta loop filter G(z) together with its good high frequency gain characteristics, is to be used instead of a more difficult to implement (or higher high frequency gain) noise shaper loop filter.

In particular, this arrangement allows the use of the efficient to implement cascade of integrators structure which can utilise shifters rather than multipliers, and hence utilise much less silicon area. It also provides lower sensitivity to coefficients allowing for easier and cheaper implementation. In addition the sigma delta architecture provides a good high frequency gain response, so that unlike noise shaping loop filters there is not the same high level of out-of-band noise resulting in intermodulation and poor SNR. A further advantage is that known art for designing sigma-delta loop filters can be directly applied to this new WLR circuit topology.

This WLR circuit therefore provides the reduced wordlength PCM words to the PWM, whilst minimising quantisation noise. At the same time the effect of the noise shaping on the pre-distorting effect of the lineariser is also minimised. And this is all achieved in a relatively easy to implement circuit architecture.

Figure 8A:
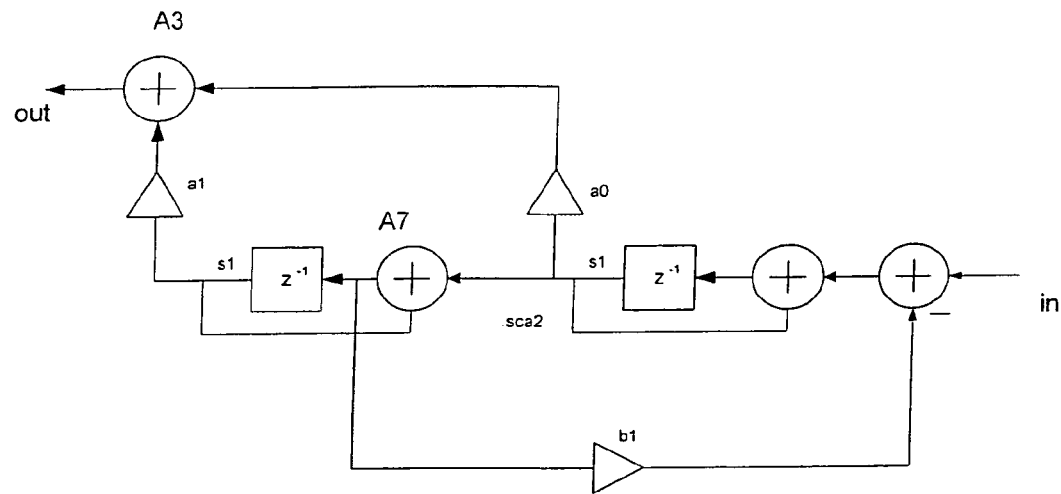
FIG. 8a, 8b, 8c show respectively a sigma delta loop filter, a noise shaper loop filter, and an IIR filter.
Figure 8B:
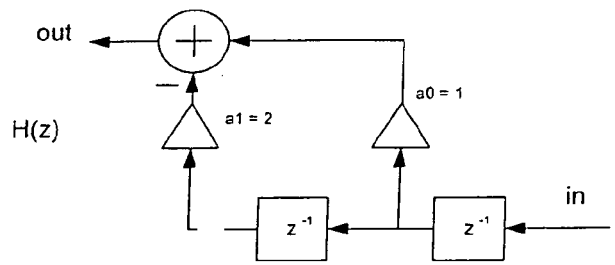
Figure 8C:
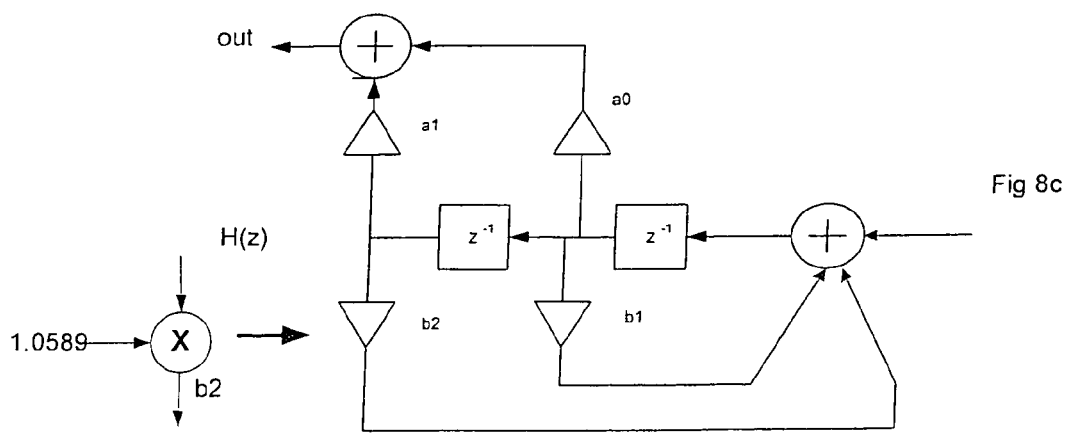

In FIGS. 8a, 8b, and 8c, standard second order filter architectures can be seen for respectively a sigma delta loop filter G(z), a noise shaper loop filter H(z), and an IIR filter which might also be used in a noise shaper circuit architecture.

FIG. 8a shows a sigma-delta loop filter G(z) architecture comprising two integrator structures (a delay $z^{-1}$ in a feedback loop) and a number of coefficients a1, a0, and b1. Because of the integrating structures, such filter architectures G(z) typically have high gain at low frequencies, which is desirable because this translates into high attenuation of quantization noise at low (baseband) frequencies. Furthermore such an arrangement has a low sensitivity to changes in the coefficients, meaning that high wordlength coefficients such as 1.2334 can be quantized to an integer coefficient such as 1 or a simple fraction such as 1.25, which can be implemented using shifters rather than multipliers, making such architectures easy to implement.

FIG. 8b shows a noise shaping loop filter H(z) architecture having two delays and two coefficients a1 and a0. Again the coefficients are typically easy to implement numbers, in this case 1 and 2, and so may be implemented with shifters thereby reducing the implementation cost. However such filter architectures have a large high frequency gain resulting in the intermodulation problems discussed above.

FIG. 8c shows an infinite impulse response filter architecture H'(z) which can be used as the loop filter in a noise shaper WLR circuit. The advantage of using such a direct form filter is that the high frequency gain is reduced and so the intermodulation problem is similarly reduced. However, the coefficients required to implement this are typically awkward or difficult to implement numbers (e.g. 1.05896), and therefore require multipliers to implement the coefficients. However multipliers are expensive to implement, and so such circuits are more expensive and require more silicon area to implement.

Figure 10:
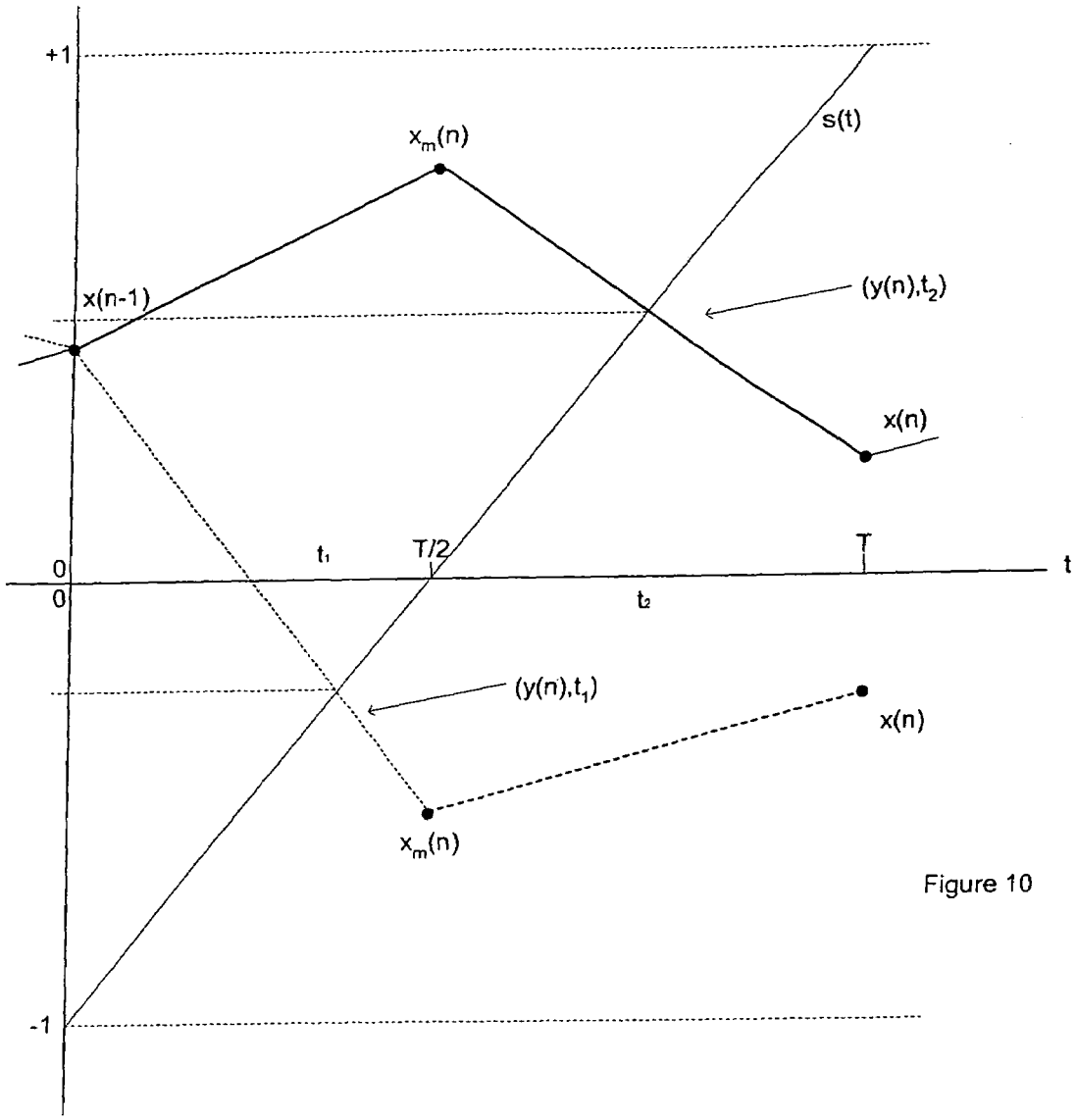
FIG. 10 illustrates a linearisation algorithm.

Various known sigma delta type loop filter implementations can be employed in the feed-back arrangements of the embodiments. For example multiple feedback (MFB) loop filter architectures are known for SDM, such as shown in FIG. 10.24 of Steven R. Norsworthy, Richard Schreies, Gabor Temes "Delta Sigma Data Converters, Theory, Design, and Simulation" IEEE press—ISBN 0-7803-1045-4.

Various other filter architectures can alternatively be used, in particular those using integrator structures which typically allow for the implementation of shifters rather than multipliers, and hence reduced implementation complexity and cost. Examples of other integrator based filters include Zolzer and Kingsbury structures.

Whilst integrator based filters are preferred, other filter architectures could also be used although the implementation advantages are reduced. In an extreme example a direct form filter may be implemented. The error transfer function of the quantizing circuit should provide high attenuation over the baseband, and the "internal" feedback arrangement around the loop filter circuit G(z) within a noise shaper feedback loop provides the 1/(1+G(z)) term required to do this. This internal feedback arrangement also advantageously provides for easy to implement filter circuits to be integrated into a noise shaper circuit architecture as shown in FIG. 7. Integrator based filter circuits G(z) typically provides high gain at low frequencies which is clearly suitable for sigma-delta based WLR circuits where the loop filter is in the signal path, however these are less suitable for noise shaper loop filter circuits which are in the feedback loop. However the circuits have useful implementation properties as discussed above, and the use of the internal or inner feedback loop within the noise shaper or outer feedback loop allows these filter circuits to be used in this context. This compares favourably with known approaches where direct form IIR type filters are generally required for noise shaper quantizing circuit architectures, and which generally require the implementation of multipliers to apply the required coefficients.

Figure 9:
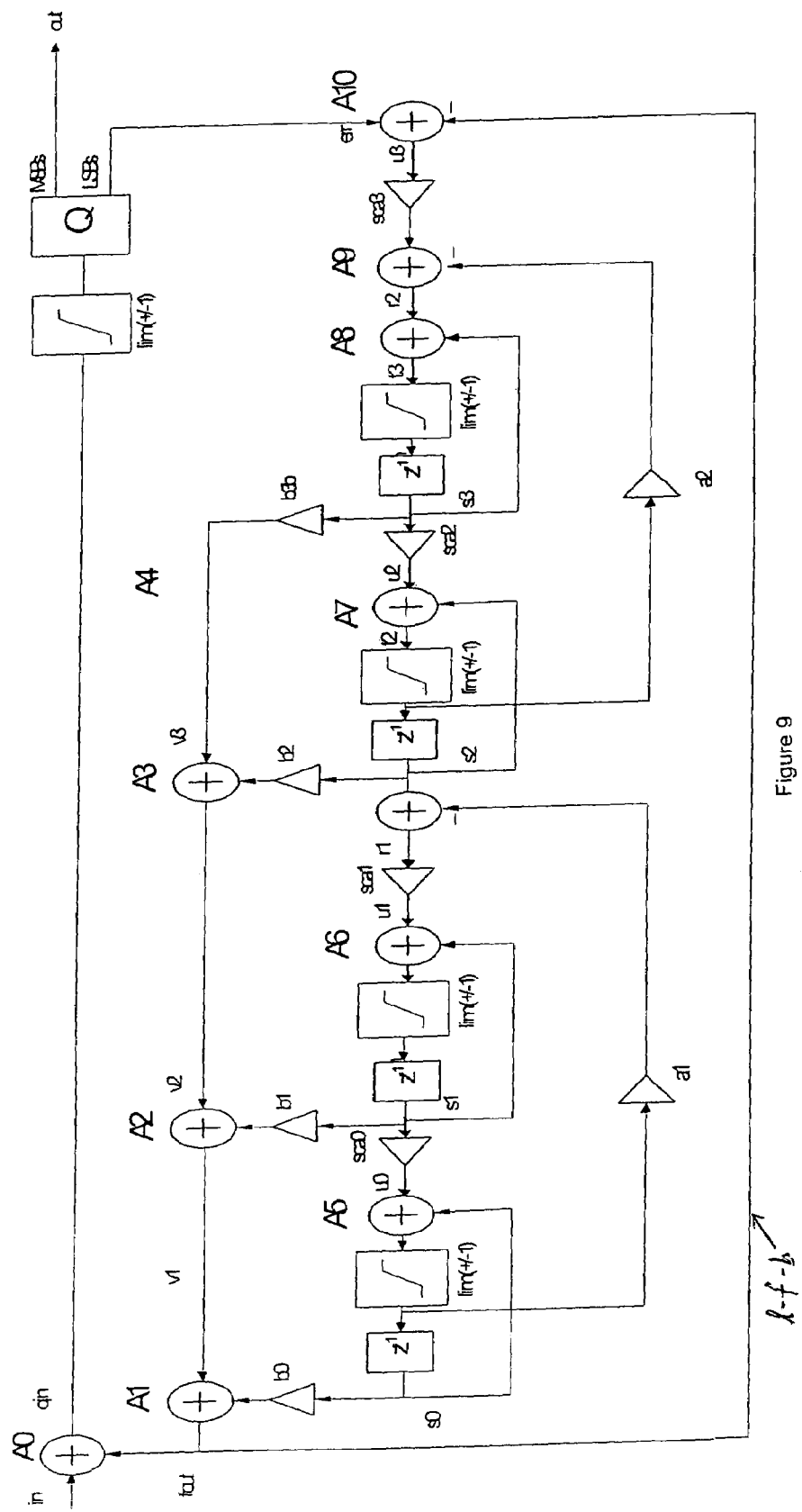
FIG. 9 shows a $4^{th}$ order implementation of the word length reduction circuit of FIG. 7.

FIG. 9 shows a preferred fourth order modulator implementation according to an embodiment. A0 is the input adder, and A10 is the additional adder forming a loop around the loop filter G(z). The error signal from the quantiser is determined directly from the quantiser LSBs i.e. those bits which are not passed to the output. Using the least significant bits (LSB) from the quanitiser as the feedback signal, and the most significant bits (MSB) from the quantiser as the reduced wordlength signal is equivalent to taking the difference between the input and output of the quanitiser as the feedback signal (as was shown in FIGS. 6 and 7). The loop filter function G(z) is implemented by the remaining adders A1–A9 and associated delays as is known for cascade-of-integrator based structures. These offer low sensitivity to coefficient quantisation and can be implemented without multipliers. The b coefficients implement the poles of the noise shaping function and the a coefficients implement the zeros. The limiters prevent the circuit becoming unstable, for example if the maximum input level is exceeded. The scaling factors normalise the dynamic range of the signal so that each node has a similar maximum signal level. The inner or local feedback loop for the loop filter G(z) is indicated by reference 1-$f$-b.

Given increasing implementation complexity with increasing direct form filter order, it can be seen that as the order increases, so does the implementation advantage. For example a tenth order modulator would be extremely difficult to implement using a direct form filter but relatively easy to implement by extending the above embodiment. In fact any order greater than one can have certain benefits by applying the arrangements shown in the embodiments.

Whilst embodiments have been described with respect to a PCM-PWM Converter, other digital amplifier arrangements are also possible, including for example Converters receiving Super_audio encoded sampled signals and/or utilising PDM to drive the power switch 3.

Also whilst embodiments of the WLR circuit have been described with respect to a digital amplifier system, the WLR circuit could also be used in other applications such as for DSD (Direct Stream Digital) modulation. The circuit architecture would in this case use a 1-bit quantizer.

There is also provided a lineariser or linearisation algorithm which can advantageously be combined with the above described WLR arrangements and pulse width modulator of the Converter. A Lineariser adjusts the values of the incoming input signal samples in order to provide better cross-point calculations at the PWM modulator and hence a pulse width modulated signal that is closer to that which would have been obtained with natural sampling as previously described. It does this by estimating what the cross-point would be between a waveform defined by two adjacent input samples of the input signal, and adjusting the amplitude of the (first) sample to that of the cross-point. The cross-point is the point (in time and amplitude) at which the input waveform crosses a reference waveform (typically sawtooth or triangular) corresponding to the reference waveform used by the modulator to determine the pulse duration or width for the sample.

Various approaches are known including defining a straight line waveform between the two sample points and then determining the cross-point between this waveform and the reference waveform. An embodiment is described with reference to FIGS. 10 and 11 and involves first interpolating input samples . . . , w(n−1), w(n), . . . with sampling period T, to derive a set of samples . . . , x(n−1), xm(n), x(n), . . . with sampling period T/2. A piecewise linear signal approximation is then used between these samples to derive a good approximation to the amplitude of the signal at the cross-point that would have been obtained by Natural Sampling. A simplified implementation is obtained by using Taylor Series approximation of the calculations to avoid division which is expensive to implement in Silicon, and by merging the calculations or hardware required for the interpolation and cross-point estimation.

FIG. 10 illustrates a cross-point algorithm in which an intermediate sample $x_m(n)$ is derived from two adjacent input samples $w(n-1)$ corresponding to $x(n-1)$ and $w(n)$ corresponding to $x(n)$. These (x) values are then used to determine the cross point $(y(n),t_2)$ or $(y(n),t_1)$, and its corresponding amplitude in order to linearise the input samples. One input sample period of duration T from time t=0 to t=T is shown. The input signal is assumed to be normalised to lie between +1 and −1. The input signal is represented by input samples $x(n-1)$ at t=0, $x(n)$ at t=T, and a centre-point or intermediate "sample" $x_m(n)$ at t=T/2 which is determined by interpolation, as described below. The input signal is further represented by piecewise linear approximation between these points. Two possibilities are illustrated on the same diagram: the solid lines illustrate the scenario where $x_m(n)>=0$, the dashed lines illustrate the scenario where $x_m(n)<0$. The saw-tooth reference waveform s(t) corresponds to the waveform that will be used by the modulator to determine the pulse width for each sample: i.e. the value y(n) of signal corresponding to the intersection of s(t) with the piecewise linear approximation to the signal.

Since $x(n-1)>-1$, it will lie above the line s(t). Similarly $x(n)<1$, so will lie on the other side of s(t). If $x_m(n)=0$, the cross-point will be at T/2. If $x_m(n)<0$ then $x_m(n)$ lies under the line s(t), i.e. on the same side of s(t) as $x(n)$, but on the opposite side to $x(n-1)$, so the cross-point must lie on the segment of the line joining $x(n-1)$ and $x_m(n)$. Similarly, if $x_m(n)>0$, the cross-point must lie on the segment of the line joining $x_m(n)$ and $x(n)$. From the geometry of FIG. 10, since the equations of the respective segments of the lines are different, a different calculation will be necessary in each case. From the line equations, it is possible to derive the following two equations for the two respective cross-points $t_1$ and $t_2$.

$$t_1 = (T/2)\frac{2x_m(n) - x(n) + 1}{1 - x(n) + x_m(n)}$$

$$t_2 = (T/2)\frac{x(n-1) + 1}{1 - x_m(n) + x(n-1)}$$

These equations can be back-substituted into the equation for s(t) to derive equations for the sample amplitudes which correspond to the cross-points.

$$y(n) = \frac{x_m(n)}{1 - x(n) + x_m(n)} \quad \text{if } x_m(n) < 0$$

$$y(n) = \frac{x_m(n)}{1 - x_m(n) + x(n-1)} \quad \text{otherwise}$$

Whilst a single intermediate point is preferred for simplicity, for increased accuracy embodiments can be derived which employ two or more intermediate sample points and which utilise different line equations between each point.

To avoid division, which is expensive in terms of component count and chip area in a hardware implementation, the expressions can be expanded by using three terms from the Taylor Series, resulting in the expressions:

$y(n)=x_m(n)(1-(x_m(n)-x(n))+(x_m(n)-x(n))^2)$ if $x_m(n)<0$ $y(n)=x_m(n)(1-(x(n-1)-x_m(n))+(x(n-1)-x_m(n))^2)$ otherwise Thus we can derive a "linearised" value for the signal sample y(n), based on the values $x(n-1)$, xm(n), $x(n)$.

To derive the interpolated sample $x_m(n)$, from the input signal samples w(n,) acceptable performance is achieved using a simple second order linear interpolator. This implements interpolation by zero-interleaving the input, preferably followed by filtering using the transfer function:

$$V(z) = \frac{(1 + z^{-1})^2}{4}$$

Note that the best performance is achieved if all three inputs are filtered, rather than just calculating $x_m(n)$ from $x(n-1)$ and $x(n)$ using the above equation. Preferably the input sequence is zero-interleaved such that the input sequence into the filter is . . . , $w(n-1)$, 0, $w(n)$, 0, . . . , then passed through the filter V(z) to derive a sequence of output samples. Triplets of these output samples form $x(n-1)$, $x_m(n)$ and $x(n)$.

It can be shown that for an input w(n) to the interpolator, the three outputs can be calculated using the expressions:

$$x(n-1) = \frac{w(n-1) + 3w(n-2)}{4}$$

$$x_m(n) = \frac{3w(n-1) + w(n-2)}{4}$$

$$x(n) = \frac{w(n) + 3w(n-1)}{4}$$

Note that these calculations need to be calculated only once per input sample. Substituting these equations back into the equations for y(n) we obtain the equation:

$$y = \begin{cases} b(1 + c(1 + c)) & \text{if } b \geq 0 \\ b(1 + a(1 + a)) & \text{otherwise} \end{cases}$$

where:

$$a = \frac{w(n-1) - w(n-2)}{2}$$

$$b = w(n-1) - a/2$$

$$c = \frac{w(n) - w(n-2)}{4}$$

Note that improved accuracy can be obtained by taking more terms in the Taylor Series expansion, resulting in e.g using b(1+c(1+c(1+c))) in the calculation of y.

By interpolation of the original input samples w(n) and by cross-point estimation using linear approximations between the interpolated samples and determining where the reference waveform crosses one of these, an accurate and simple to implement lineariser is achieved. In the simple case of one intermediate sample point the polarity of this point can be used to determine which linear approximation to use. Using a Taylor Series approximation further simplifies the calculations. Thus by combining the interpolation and the cross-point estimation equations, an algorithm to obtain a revised sequence of signal samples y(n) emulating a Naturally Sampled signal, suitable for input to a PWM modulator is provided. The algorithm provides a more accurate cross-point calculation than a straight line approximation approach, and at the same time is simple and low cost to implement, as the interpolation and cross-point estimation hardware is implicitly merged.

Figure 11:
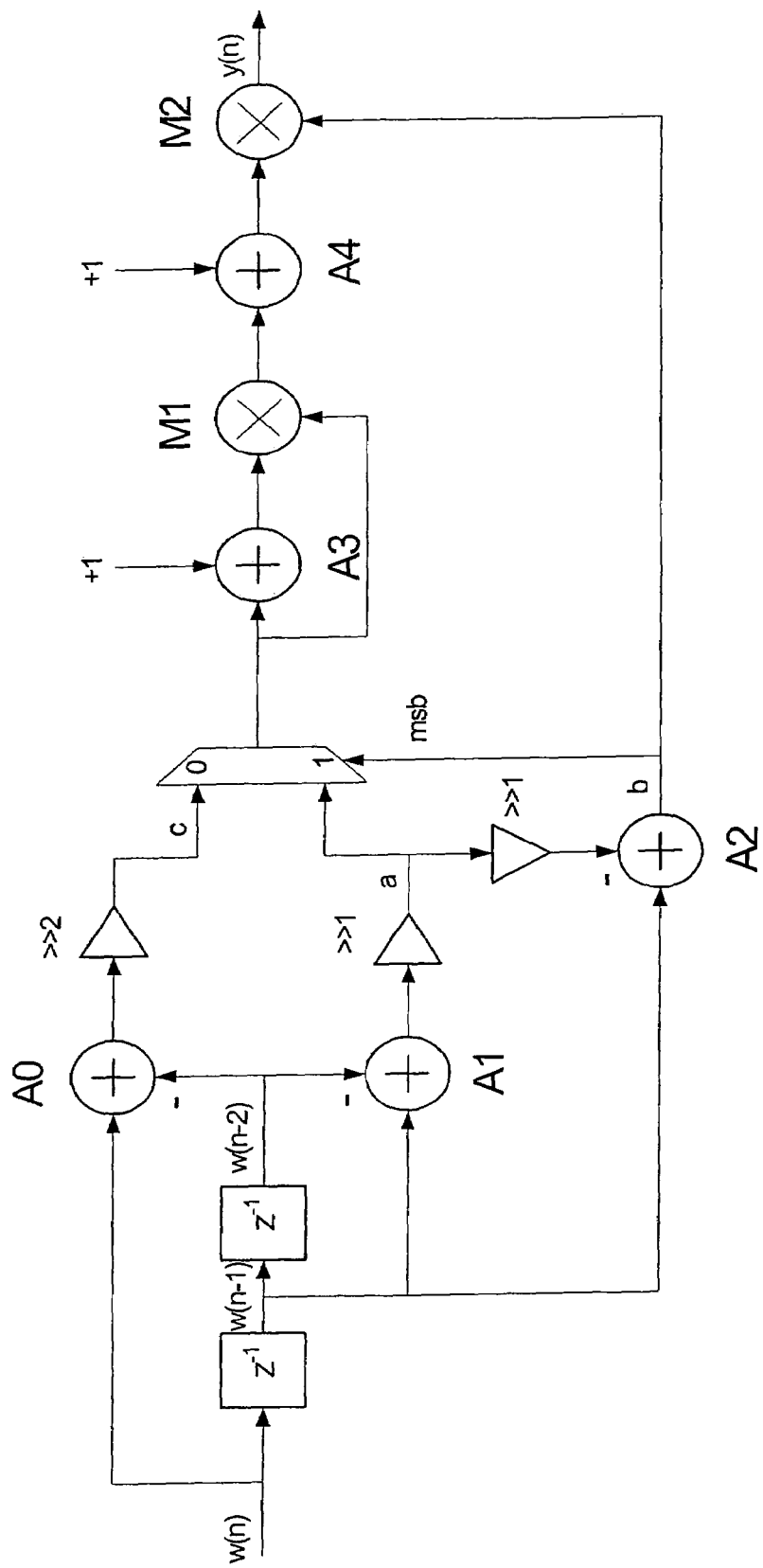
FIG. 11 shows a circuit for implementing the algorithm of FIG. 10.

An implementation of this linearisation algorithm is shown in FIG. 11. The implementation uses a very low-complexity interpolation filter to derive the centre point. The interpolation filter and cross-point algorithm are combined resulting in a low implementation cost. The input w(n) is passed into two delays, to produce signals w(n−1) and w(n−2). Adders A0, A1, A2 and the associated right shifts implement the equations for a, b and c. The Multiplexor implements the decision logic according to the sign of b. Multipliers M1, M2 and adders A3, A4 implement the Taylor Series Expansion.

The skilled person will recognise that the above-described apparatus and methods may be embodied as processor control code, for example on a carrier medium such as a disk, CD- or DVD-ROM, programmed memory such as read only memory (Firmware), or on a data carrier such as an optical or electrical signal carrier. For many applications embodiments of the invention will be implemented on a DSP (Digital Signal Processor), ASIC (Application Specific Integrated Circuit) or FPGA (Field Programmable Gate Array). Thus the code may comprise conventional programme code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analog array or similar device in order to configure analog hardware.

The skilled person will also appreciate that the various embodiments and specific features described with respect to them could be freely combined with the other embodiments or their specifically described features in general accordance with the above teaching. The skilled person will also recognise that various alterations and modifications can be made to specific examples described without departing from the scope of the appended claims.

The invention claimed is:

1. A word length reduction circuit for quantising an N-bit input signal sample into an n-bit output signal sample; the circuit comprising:
   an input for receiving the N-bit input signal samples;
   a quantiser coupled to the input, and arranged to output an n-bit signal corresponding to the N-bit input sample signal; and
   an outer feedback loop comprising a loop filter, the least significant N-n bits of the signal input to the quantizer being coupled to the loop filter, the output of the loop filter being provided to a subtractor coupled to the word length reduction circuit input for subtracting a feedback signal from the input signal, the output of the loop filter being coupled to the output and the input of the loop filter to form an inner feedback loop.

2. A Converter for converting a pulse coded modulation (PCM) digital audio signal to a pulse width modulated (PWM) digital audio signal for amplification in a digital amplifier; the Converter comprising:
   a word length reduction circuit according to claim 1;
   a modulator for converting the PCM signals to PWM signals, the modulator coupled to the output of the quantising circuit.

3. A Converter according to claim 2 further comprising a Lineariser for receiving input signal samples and an output coupled to the input of the word length reduction circuit for providing linearised signal samples.

4. A Converter according to claim 3 wherein the Lineariser comprises:
   means for determining an intermediate sample between two adjacent input signal samples;
   means for determining the polarity of the intermediate sample;
   means for determining at what signal amplitude an input signal waveform defined by said input samples and the intermediate sample crosses a reference waveform by applying one of two estimation algorithms dependent on the polarity of the intermediate sample; and
   means for outputting a linearised signal sample having an amplitude corresponding to the determined crossing amplitude.

5. A Converter according to claim 4 wherein the intermediate sample determining means is an interpolator.

6. A Converter according to claim 5 wherein the interpolator is a filter with a zero interleaved input.

7. A Converter according to claim 4 wherein the estimation algorithms are linear or straight line approximations.

8. A Converter according to claim 7 wherein the means for determining an intermediate sample and the means for determining the signal amplitude are merged by implementing the estimation algorithms:

$$y = \begin{cases} b(1 + c(1 + c)) & \text{if } b \geq 0 \\ b(1 + a(1 + a)) & \text{otherwise} \end{cases}$$

where:

$$a = \frac{w(n-1) - w(n-2)}{2}$$

$$b = w(n-1) - a/2$$

$$c = \frac{w(n) - w(n-2)}{4}$$

w(n)=input signal sample at sample time n.

9. A Converter according to claim 4 wherein the signal amplitude determining means comprises implementing Taylor Series calculations.

10. A digital amplifier comprising a Word length Reduction circuit according to claim 1 or a Converter according to claim 2.

11. A circuit according to claim 1 wherein the subtractor is an adder for coupling the outer feedback loop to the circuit input.

12. A circuit according to claim 11 further comprising a second adder for coupling the outer feedback loop to the input of the loop filter, such that the second feed-back loop signal is subtracted from the feed-back signal from the quantiser.

13. A circuit according to claim 1 wherein the loop filter comprises an integrator structure.

14. A circuit according to claim 1 wherein the loop filter is a sigma-delta loop filter.

15. A circuit according to claim 1 wherein the loop filter coefficients are implemented using shifters.

16. A circuit according to claim 1, the loop filter further comprising limiters to limit signal levels and scaling factors to normalise signal dynamic ranges.

17. A word length reduction method for quantising an N-bit input signal sample into an n-bit output signal sample; the method comprising:
receiving the N-bit input signal samples;
quantising the input signal samples in order to output an n-bit signal corresponding to the N-bit input sample signal;
subtracting a feedback signal from the input signal, the feedback signal being derived from the least significant N-n bits of the signal to be quantized, and filtering the feedback signal with a loop filter having an inner feedback loop coupled between the output and the input of the loop filter.

18. A method for converting a pulse coded modulation (PCM) digital audio signal to a pulse width modulated (PWM) digital audio signal for amplification in a digital amplifier; the method comprising:
word length reducing an N-bit input signal sample into an n-bit output signal sample according to claim 17;
modulating said word length reduced PCM signals into PWM signals.

19. A method according to claim 18 further comprising linearising said received input signal samples prior to said word length reduction.

20. A method according to claim 19 wherein the Linearising comprises:
determining an intermediate sample between two adjacent input signal samples;
determining the polarity of the intermediate sample;
determining at what signal amplitude an input signal waveform defined by said input samples and the intermediate sample crosses a reference waveform by applying one of two estimation algorithms dependent on the polarity of the intermediate sample;
outputting a linearised signal sample having an amplitude corresponding to the determined crossing amplitude.

21. A method according to claim 20 wherein the estimation algorithms are linear or straight line approximations.

22. A method according to claim 21 wherein determining the intermediate sample and determining the signal amplitude merged using the estimation algorithms:

$$y = \begin{cases} b(1 + c(1 + c)) & \text{if } b \geq 0 \\ b(1 + a(1 + a)) & \text{otherwise} \end{cases}$$

where:
$$a = \frac{w(n-1) - w(n-2)}{2}$$
$$b = w(n-1) - a/2$$
$$c = \frac{w(n) - w(n-2)}{4}$$

w(n)=input signal sample at sample time n.

23. A method according to claim 20 wherein the intermediate sample determining comprises interpolation.

24. A method according to claim 20 wherein the signal amplitude determining comprises a Taylor Series calculation.

25. A method of digitally amplifying an audio signal comprising a Word length Reducing method according to claim 17 or a method of Converting according to claim 18.

26. A method according to claim 17 wherein the loop filter comprises an integrator structure.

27. A method according to claim 17 wherein the loop filter is a sigma-delta loop filter.

28. A carrier medium carrying processor readable code for controlling a processor to carry out the method of claim 17.

29. A noise shaper circuit for reducing the word length of a digital audio amplifier, the circuit comprising a quantiser in a feedback loop with a loop filter, the difference between the input and output of the quantizer being coupled to the input of the loop filter, wherein the circuit is arranged such that the input signal is unfiltered and the noise transfer function is 1/(1+G(z)) where G(z) is the loop filter.

30. A word length reduction circuit for quantizing an N-bit input signal sample into an n-bit output signal sample, the circuit comprising:
an input for receiving the N-bit input signal samples;
a quantizer coupled to the input, and arranged to output an n-bit signal corresponding to the N-bit input sample signal;
an outer feedback loop comprising a loop filter coupled between the output of the quantizer and a subtractor coupled to the word length reduction circuit input for subtracting a feedback signal from the input signal, the loop filter having an inner feedback loop coupled between the output and the input of the loop filter and further comprising limiters to limit signal levels and sealing factors to normalize signal dynamic ranges.

31. A Converter for converting a pulse coded modulation (PCM) digital audio signal to a pulse width modulate (PWM) digital audio signal for amplification in a digital amplifier; the Converter comprising:
a word length reduction circuit for quantizing an N-bit input signal sample into a n-bit output signal sample, the circuit comprising:
an input for receiving the N-bit input signal samples;
a quantizer coupled to the input, and arranged to output an n-bit signal corresponding to the N-bit input sample signal;
an outer feedback loop comprising a loop filter coupled between the output of the quantizers and a subtractor coupled to the word length reduction circuit input for subtracting a feedback signal from the input signal, the loop filter having an inner feedback loop coupled between the output and the input of the loop filter;
a modulator for converting the PCM signals to PWM signals, the modulator coupled to the output of the quantizing circuit; and
a Linearizer for receiving input signal samples and an output coupled to the input of the word length reduction circuit for providing linearized signal samples, the Linearizer comprising:
means for determining an intermediate sample between two adjacent input signal samples;
means for determining the polarity of the intermediate sample;
means for determining at what signal amplitude an input signal waveform defined by said input samples and the intermediate sample crosses a reference waveform by applying one of two estimation algorithms dependent on the polarity of the intermediate sample; and
means for outputting a linearized single sample having an amplitude corresponding to the determined crossing amplitude.

32. A method for converting a pulse coded modulation (PCM) digital audio signal to a pulse width modulated (PWM) digital audio signal for amplification in a digital amplifier; the method comprising:

word length reducing an N-bit input signal sample into an n-bit signal by:
  receiving the N-bit input signal samples;
  quantizing the input signal samples in order to output an n-bit signal corresponding to the N-bit input sample signal;
  subtracting a feedback signal from the input signal, the feedback signal derived from the output of the quantizer, and filtering the feedback signal with a loop filter having an inner feedback loop coupled between the output and the input of the loop filter; and
 modulating said word length reduced PCM signals into PWM signals, linearizing said received input single samples prior to said word length reduction, wherein the Linearizing comprises:

determining an intermediate sample between two adjacent input signal samples;

determining the polarity of the intermediate sample;

determining at what signal amplitude an input signal waveform defined by said input samples and the intermediate sample crosses a reference waveform by applying one or two estimation algorithms dependent on the polarity of the intermediate sample;

outputting a linearized signal sample having an amplitude corresponding to the determined crossing amplitude.

\* \* \* \* \*